United States Patent
Bejtlich

(10) Patent No.: US 6,299,713 B1
(45) Date of Patent: Oct. 9, 2001

(54) OPTICAL RADIATION CONDUCTING ZONES AND ASSOCIATED BONDING AND ALIGNMENT SYSTEMS

(75) Inventor: Leonard M. Bejtlich, Jonestown, TX (US)

(73) Assignee: L. M. Bejtlich and Associates, LLC, Jonestown, TX (US)

( * ) Notice: Subject to any disclaimer, the term of this patent is extended or adjusted under 35 U.S.C. 154(b) by 0 days.

(21) Appl. No.: 09/354,642

(22) Filed: Jul. 15, 1999

(51) Int. Cl.[7] ................................................ B32B 31/00
(52) U.S. Cl. ................................................ 156/64; 156/292
(58) Field of Search .................... 156/64, 292, 308.2, 156/309.6, 309.9, 362, 363

(56) References Cited

U.S. PATENT DOCUMENTS

| | | | |
|---|---|---|---|
| 4,731,282 | 3/1988 | Tsukagoshi et al. | 428/220 |
| 5,145,257 | 9/1992 | Bryant et al. | 374/131 |
| 5,258,824 | * 11/1993 | Carlson et al. | 356/382 |
| 5,399,018 | * 3/1995 | Hollander et al. | 374/121 |
| 5,549,756 | 8/1996 | Sorensen et al. | 118/715 |
| 5,598,014 | * 1/1997 | Barany et al. | 257/187 |
| 5,893,643 | 4/1999 | Kumar et al. | 374/131 |

FOREIGN PATENT DOCUMENTS

| | | | |
|---|---|---|---|
| 195 04 967 A1 | 8/1996 | (DE) | H01L/21/603 |
| 0 715 201 A2 | 5/1996 | (EP) | G02F/1/13 |

OTHER PUBLICATIONS

Kuniteru, M., "Circuit Position Alignment Tool for Flexible Printed Wiring Board and Transparent Substrate and its Operating Method", *Patent Abstracts of Japan*, vol. 15, No. 121, (JP03011571), Mar. 25, 1991.

Hiroshi, O., "Production of Laminated Chip", *Patent Abstracts of Japan*, vol. 1999, No. 10, (JP11126869), Aug. 31, 1999.

Yuji, K., "Manufacture of Liquid Crystal Element", *Patent Abstracts of Japan*, vol. 14, No. 148, (JP02008884), Mar. 20, 1999.

Yuji, K., "Production of Liquid Crystal Element", *Patent Abstracts of Japan*, vol. 15, No. 51, (JP02282719), Feb. 6, 1991.

\* cited by examiner

*Primary Examiner*—James Sells
(74) *Attorney, Agent, or Firm*—Fulbright & Jaworski

(57) ABSTRACT

A method of processing a substrate includes: locating the substrate and a first connector between a bonding head and an optical radiation detector, the substrate having an optical radiation conductive zone and a second connector that is at least partially coincident with the optical radiation conductive zone; and bonding the first connector to the second connector so as to form an electronic connection between the first connector and the second connector, wherein bonding includes moving the bonding head away from both the first connector and the second connector after a time period that is at least in part a function of a temperature that is measured by the optical radiation detector. Another method of processing a substrate includes: locating the substrate and a first connector between a source of optical radiation and an optical radiation detector, the substrate having an optical radiation conductive zone and a second connector that is at least partially coincident with the optical radiation conductive zone; and aligning the first connector and the second connector with respect to at least one axis so as to substantially maximize the amount of optical radiation from the source of optical radiation that is detected by the optical radiation detector. The systems and methods provide advantages because the optical radiation conducting zone facilitates improved alignment and/or bonding of components to the substrate, especially components with pitch leads to printed circuit boards (PCBs).

17 Claims, 3 Drawing Sheets

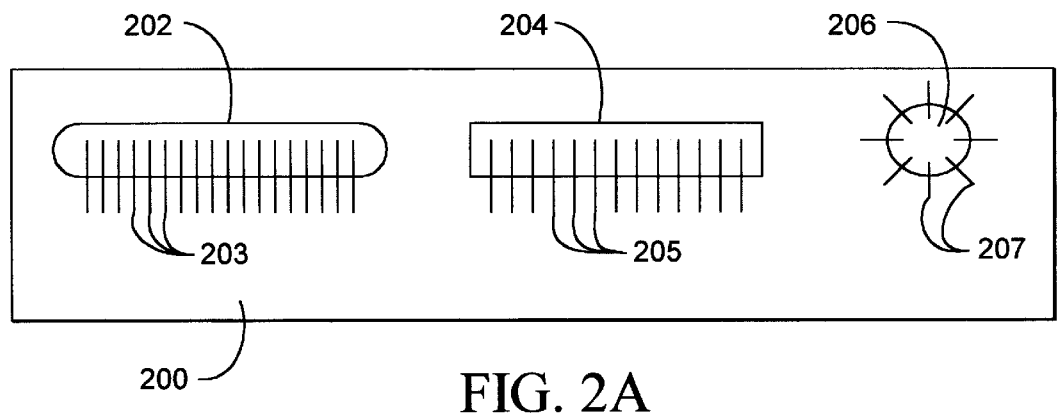
FIG. 2A
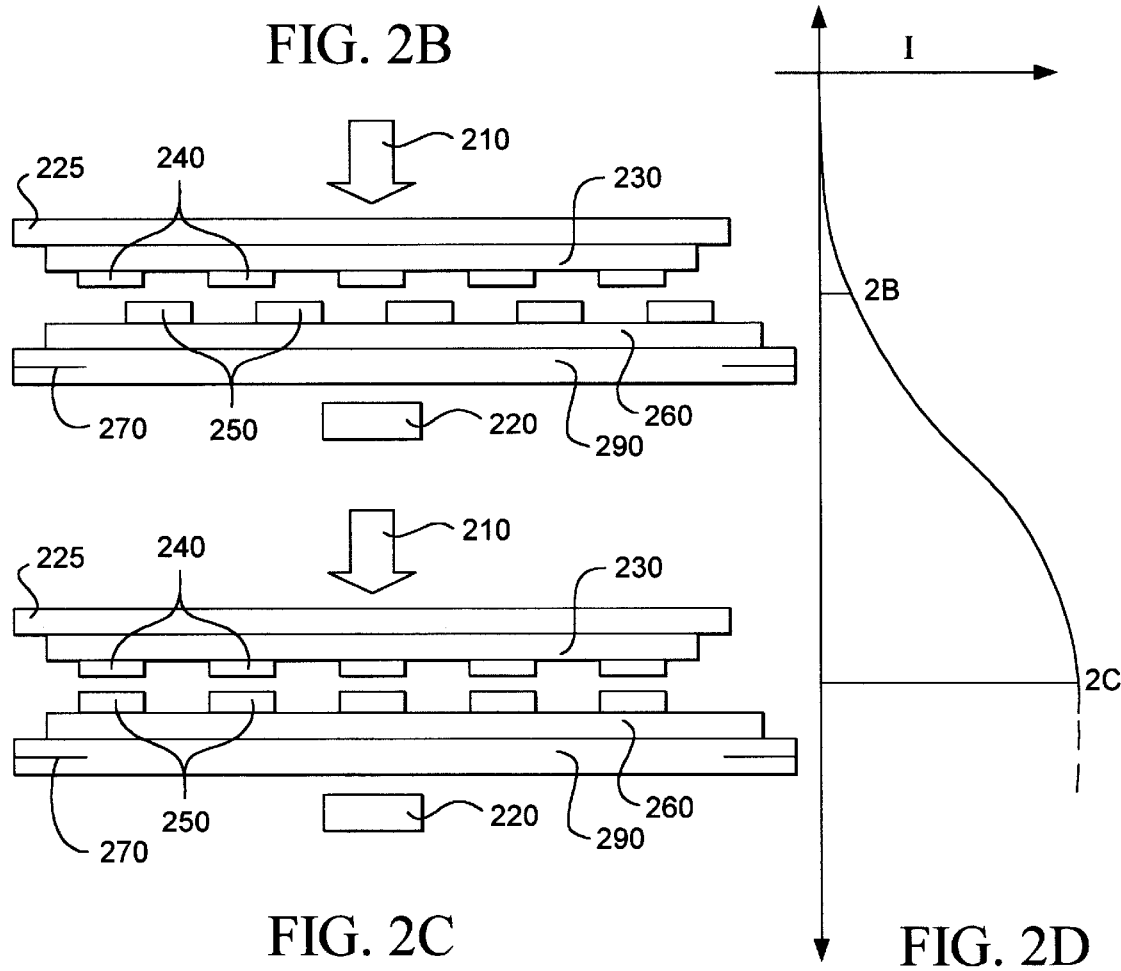
FIG. 2B
FIG. 2C
FIG. 2D

OPTICAL RADIATION CONDUCTING ZONES AND ASSOCIATED BONDING AND ALIGNMENT SYSTEMS

BACKGROUND OF THE INVENTION

1. Field of the Invention

The invention relates generally to the field of electronics. More particularly, the invention relates to electronic substrates such as liquid crystal diode screens or circuit boards that have at least one optical radiation conducting zone. Specific embodiments of the invention are directed to alignment systems and/or bonding systems that can be utilized in conjunction with the optical radiation conducting zone.

2. Discussion of the Related Art

Anisotropic conducting film (ACF) is an electronically conducting adhesive that only conducts electrons and holes in the Z plane when properly applied. Anisotropic conducting films (ACFs) make it possible to make fine pitch electrical connections between circuit boards and flex connectors, integrated circuits, glass flat panel displays, etc.

In the past, it has been possible to make 0.002" trace and 0.002" space connections, thereby making 250 connections per linear inch. The state of the art of connection density is increasing and is generally limited by the ability of equipment and fixturing to control the bonding process. A common use of this type of connection is in flat panel displays, for example, in the liquid crystal diode (LCD) screens that are often used in portable computers. This ACF bonding is the most common technique used to join tape automated bonding system (TABS) connectors to the LCD glass. The tape automated bonding connectors are coupled to integrated circuits (ICs) that connect logic and power to the row and column drivers to create dots and pixels on the LCD screen.

The quality and reliability of the ACF connection depends on the planarity, pressure and temperature of the bond interface. It is important to control the planarity, pressure and temperature of the ACF bonding process. Most manufacturers of bonding equipment use thermocouple sensors to sense and control the temperature. Thermocouple is a contact type measurement system and are subject to normal process variables that depends on physical sensor contact. In addition, these contact sensors must be placed at least a short distance from the actual bond adhesive or they would get stuck in the bond. Since the contact sensors are located away from the actual bond adhesive, a reading from such sensors measures the temperature of, for example, the bonding head, but not the temperature of the ACF film itself which is of greater interest.

Meanwhile, various remote temperature measurement systems have been developed. The below-referenced U.S. Patents disclose embodiments that were satisfactory for the purposes for which they were intended. The entire contents of U.S. Pat. Nos. 5,145,257; 5,549,756; and 5,893,643 are hereby expressly incorporated by reference into the present application as if fully set forth herein.

Heretofore, the requirements of controlling the planarity, pressure and temperature of an ACF bond have not been fully met. What is needed is a solution that simultaneously addresses all of these control requirements. The invention is directed to meeting all of these requirements, among others.

SUMMARY OF THE INVENTION

A goal of the invention is to simultaneously satisfy the requirements of controlling the planarity, pressure and temperature of the ACF bonding process on substrates which, in the case of the prior art, are not fully satisfied. Another goal of the invention is to facilitate alignment of connectors on substrates, especially pitch connectors (e.g., TABS connectors) on substrates.

One embodiment of the invention is based on a method of processing a substrate, comprising: locating said substrate and a first connector between I) 1) a source of optical radiation and 2) a bonding head and II) an optical radiation detector, said substrate having an optical radiation conductive zone and a second connector that is at least partially coincident with said optical radiation conductive zone; aligning said first connector with said second connector with respect to at least one axis so as to substantially maximize the amount of optical radiation from said source of optical radiation that is detected by said optical radiation detector; and bonding said first connector to said second connector so as to form an electronic connection between said first connector and said second connector, wherein bonding includes moving said bonding head away from both said first connector and said second connector after a time period that is at least in part a function of a temperature that is measured by said optical radiation detector. Another embodiment of the invention is based on a substrate processing apparatus, comprising: a bonding head; a source of optical radiation; an optical radiation detector; and a fixture to locate a substrate and a first connector between I) 1) said bonding head and 2) said source of optical radiation and II) said optical radiation detector, said substrate having an optical radiation conductive zone and a second connector that is at least partially coincident with said optical radiation conductive zone, wherein i) said fixture aligns said first connector with said second connector with respect to at least one axis so as to substantially maximize the amount of optical radiation from said source of optical radiation that is detected by said optical radiation detector and ii) said bonding head moves away from both said first connector and said second connector after a time period that is at least in part a function of a temperature that is measured by said optical radiation detector. Another embodiment of the invention is based on a substrate, comprising: an optical radiation conducting zone; and a connector that is at least partially coincident with said optical radiation conductive zone.

These, and other, goals and embodiments of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the invention without departing from the spirit thereof, and the invention includes all such modifications.

BRIEF DESCRIPTION OF THE DRAWINGS

A clear conception of the advantages and features constituting the invention, and of the components and operation of model systems provided with the invention, will become more readily apparent by referring to the exemplary, and therefore nonlimiting, embodiments illustrated in the drawings accompanying and forming a part of this specification, wherein like reference characters designate the same parts. It should be noted that the features illustrated in the drawings are not necessarily drawn to scale.

FIG. 2A illustrates a schematic top view of a circuit board with three different shaped optical radiation conducting apertures, representing embodiments of the invention.

FIG. 2B illustrates a first schematic side view of a pitch connector assembly in a first alignment state overlying an optical radiation conducted aperture in a circuit board, representing an embodiment of the invention.

FIG. 2C illustrates a second schematic side view of the pitch connector assembly shown in FIG. 2B in a second alignment state overlying the optical radiation conducted aperture in the circuit board, representing an embodiment of the invention.

FIG. 2D illustrates detected intensity of optical radiation as a function of alignment state, representing an embodiment of the invention.

DESCRIPTION OF PREFERRED EMBODIMENTS

Figure 1:
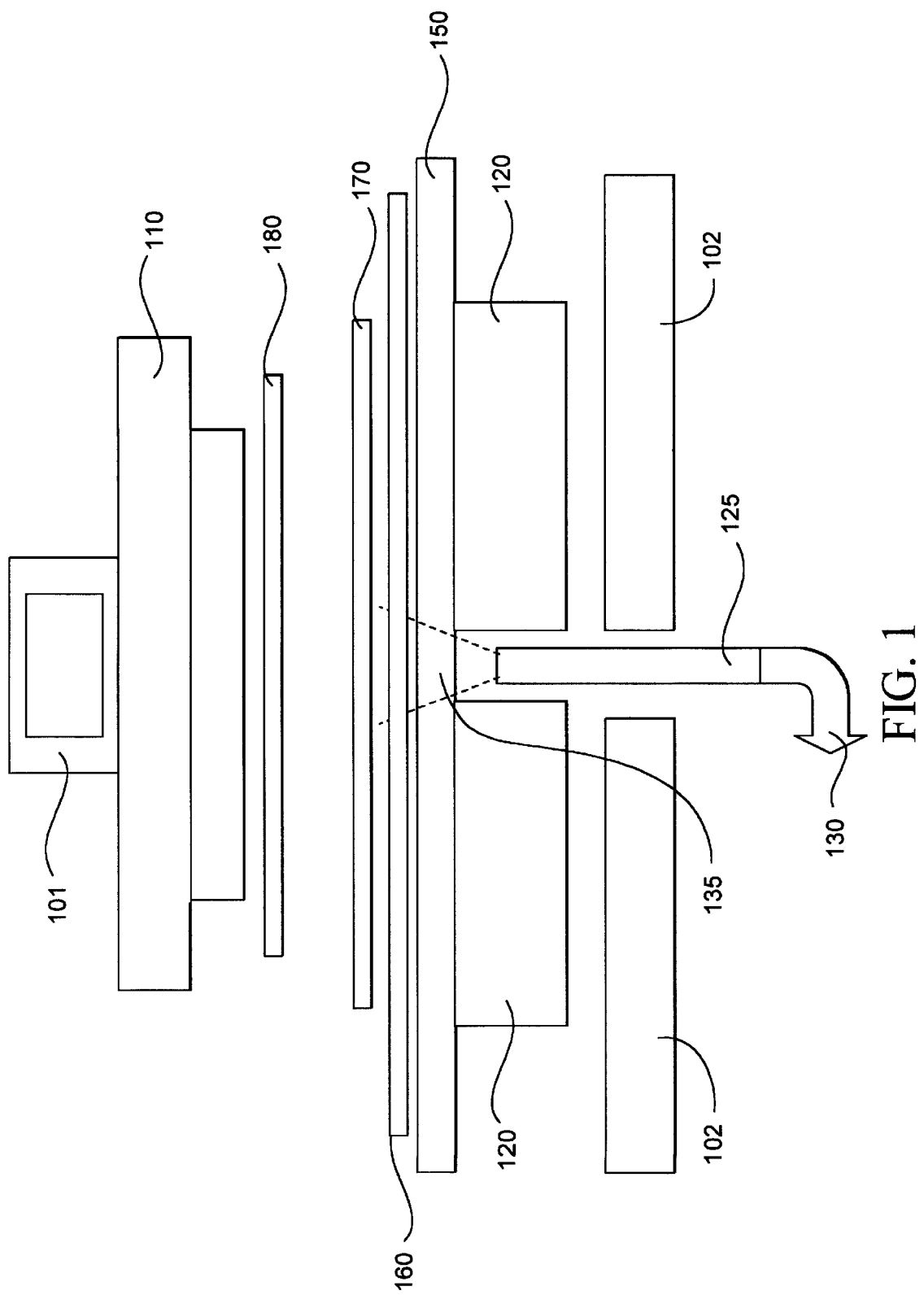
FIG. 1 illustrates a schematic side view of a system for thermal bonding with anisotropic conductive film (ACF), representing an embodiment of the invention.

The invention and the various features and advantageous details thereof are explained more fully with reference to the nonlimiting embodiments that are illustrated in the accompanying drawings and detailed in the following description of preferred embodiments. Descriptions of well known components and processing techniques are omitted so as not to unnecessarily obscure the invention in detail.

The basic concept of the invention is based on transmission of optical radiation through a substrate such as a liquid crystal diode (LCD) glass screen or a circuit board. This basic concept can be used to align components (e.g., pitch lead connectors) and/or measure temperatures related to bonding, soldering, etc.

These two aspects of the invention (i.e., alignment sensing and temperature sensing), as well as other aspects of the invention, can be combined in some embodiments of the invention. The invention can also utilize data processing methods that transform the received optical signals so as to actuate interconnected discrete hardware elements; for example, to align or re-align components or raise a heated bonding head or control process temperature.

The invention includes using an optical sensor in alignment or bonding applications where a probe (i.e. the optical sensor) is mounted beneath the surface being bonded. The invention also includes using an IR sensor in bonding applications where the probe is mounted above or next to the surface being bonded. In any case, the sensor can look through the substrate and sense the temperature at the bond. Temperature data acquired by looking through the substrate may need to be transformed via a compensation calculation in some cases because of signal attenuation.

To be implemented, the invention requires that optical radiation be detectable though at least a portion of the thickness of a substrate of interest. In the case of LCD screens with indium tin oxide traces, the substrate is usually sufficiently transmissive. However, circuit boards typically contain a metallic ground plane. Such a metallic ground plane is usually thick enough to be termed opaque. Such a metallic ground plane is also usually laminated between additional layers.

The concept of the invention includes eliminating the ground plane of a circuit board in certain areas, thereby defining one, or more, apertures. If a detectable portion of optical radiation incident one, or more, of these apertures is transmitted so that the optical radiation can pass from a first side of the circuit board to a second side of the circuit board, the aperture(s) can be termed optical radiation conducting aperture(s). Such optical radiation conducting aperture(s) can be filled with fiberglass, plastic or other laminate material(s), or the aperture(s) can be left open as void(s).

The invention includes optically sensing temperature (e.g., ACF TABS process temperatures) via the wavelength of infrared (IR) radiation transmitted through the substrate (e.g., LCD screen or circuit board). The invention also includes optically sensing alignment of structures (e.g., pitch connectors) overlying the aperture via the intensity of infrared (IR) radiation transmitted through the substrate (e.g., LCD screen or circuit board).

The invention can use an infrared (IR) detector that is a non-contacting device and that looks through the back side of the circuit board or other substrate (e.g., glass) and directly into the bond itself. This provides the significant advantages of a more accurate, reliable sensing and faster response than a thermocouple. By drilling a small hole in the base of a fixture that holds the circuit board or other substrate, a fiber-optic probe can inserted into the hole to sense process conditions more directly.

Infrared (IR) fiber-optic sensing cables and temperature read-out devices are readily commercially available. The fiber-optic lens at the end of such a sensing cable can be matched by the manufacturer to make measurements through glass. Alternatively, if the substrate is a circuit board or other less transparent material, a different lens can be used or an emissivity correction calculation can be made.

The invention includes using the IR light transmittance through a fiberglass circuit board by designing light paths into the board structure, or placing holes in a printed circuit board (PCB) to sense the temperature at the surface of the PCB. Such light paths can be multidimensional.

The invention includes using an IR mask with some portions that have high thermal conductivity and high emissivity, to block the IR path from the source of optical radiation (e.g., heated bonding head). Such an IR mask can be removed from the substrate, or process apparatus, after the IR sensing is completed.

The invention can also be extended to the design and manufacture of printed circuit boards (PCBs). By designing printed circuit boards such that light will travel through the board, it is possible to more accurately sense processing temperatures on the surface of the board. As noted above, the ground plane is a circuit board can be fabricated to define apertures through which processing conditions can be sensed. For example, the invention can be used for ACF bonds to the circuit board surface. As another example, the invention can be used for production soldering components to the circuit board as with surface mount components.

The thickness of the remaining components of the circuit board coincident with such an aperture is important. When the thickness of the circuit board coincident with the aperture is excessively low, the circuit board may have insufficient strength. On the other hand, when the thickness of the circuit board coincident with the aperture is excessively high, the optical transmissivity may be too low.

While not being limited to any particular performance indicator or diagnostic identifier, preferred embodiments of the invention can be identified one at a time by testing for the presence of adequate detected emissivity. The test for the presence of adequate detected emissivity can be carried out without undue experimentation by the use of a simple and conventional optical radiation transmission experiment. Another way to seek embodiments having the attribute of adequate detected emissivity is to test for the presence of narrow standard deviation of a performance variable, such as the resistance of a connection and/or the alignment of the connector.

The term coupled, as used herein, is defined as connected, although not necessarily directly, and not necessarily mechanically. The term substantially, as used herein, is defined as approximately (e.g., preferably within 10% of, more preferably within 1% of, most preferably within 0.1% of).

EXAMPLES

Specific embodiments of the invention will now be further described by the following, nonlimiting examples which will serve to illustrate in some detail various features of significance. The examples are intended merely to facilitate an understanding of ways in which the invention may be practiced and to further enable those of skill in the art to practice the invention. Accordingly, the examples should not be construed as limiting the scope of the invention.

Example 1

Referring to FIG. 1, an LCD connector bonding process will now be described. A hydraulic press includes a press ram 101 and a press base 102. The press ram 101 is coupled to a bonding head 110. The bonding head 110 can be a periodically heated bonding head (i.e., a thermode) or a constantly heated bonding head. The press base 102 is coupled to an insulating and alignment fixture 120. Both the press base 102 and the insulating and alignment fixture 120 are provided with passage ways in which an IR sensor 125 is located. The IR sensor 125 is coupled to an optical cable 130 that routes data to a temperature display (not shown in FIG. 1). The IR sensor 125 defines a zone of vision 135. A liquid crystal diode (LCD) screen 150 is located on top of the insulating and alignment fixture 120. A layer of anisotropic conducting film 160 is located on top of the LCD screen 150. A tape automated bonding system connector 170 is located on top of the layer of anisotropic conducting film 160. A conformal IR mask 180 is located between the heated bonding head 110 and the tape automated bonding system connector 170.

When the press ram 101 is moved toward the press base 102, the pitch bond subassemblies discussed above will be brought into contact, and compression, with one another. Meanwhile, temperature data from the zone of vision 135 is being transmitted to the temperature display. The force supplied between the press ram 101 and the press base 102 is controllable to achieve a given amount of pressure between the subcomponents. The geometrical alignment of the heated bonding head 110 and the insulating and alignment fixture 120 serves to derive planarity with regard to these subcomponents. The press ram 101 and the press base 102 can be moved apart from one another when a combination of detected temperature and elapsed time is sufficient to ensure sufficient bonding.

Figure 3A:
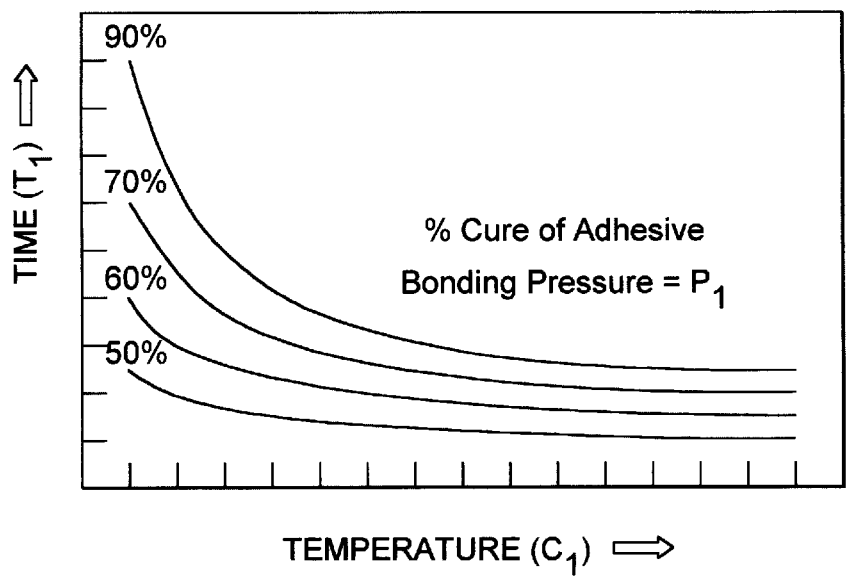
FIG. 3A illustrates a four anisotropic conductive film curing states (i.e., 30%, 50%, 70% and 90%) as a function of both time ($T_1$) and temperature ($C_1$), representing embodiments of the invention.

Referring to FIG. 3A, it can be appreciated that the percent cure of the adhesive at a given bonding pressure $P_1$ is a function of both time and temperature. Given a bonding pressure $P_1$ and a desired percent cure, a set of solutions with regard to time and temperature ($T_1$ and $C_1$, respectively) can be calculated. The optimum solution will be based on the minimum amount of time necessary to achieve the desired percent cure while maintaining thermal integrity. In this way, maximum productivity from the equipment can be achieved.

Figure 3B:
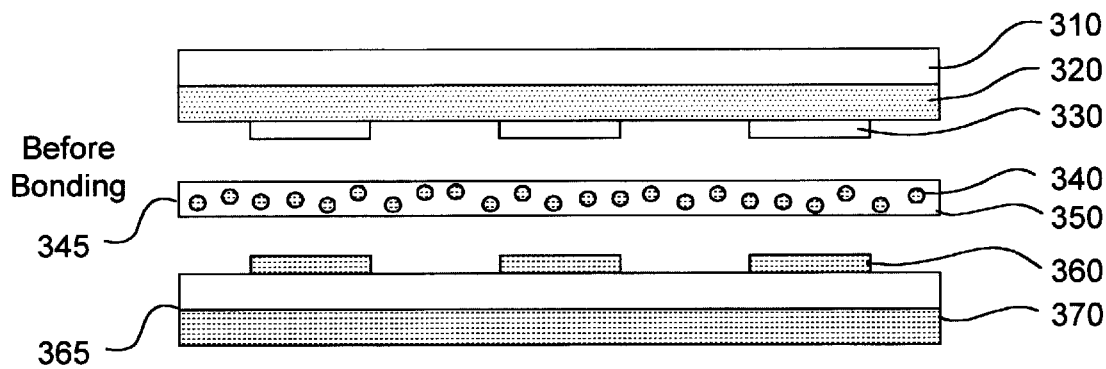
FIG. 3B illustrates a schematic side view of the structural sub-components of an anisotropic conductive film connector assembly before bonding, representing an embodiment of the invention.
Figure 3C:
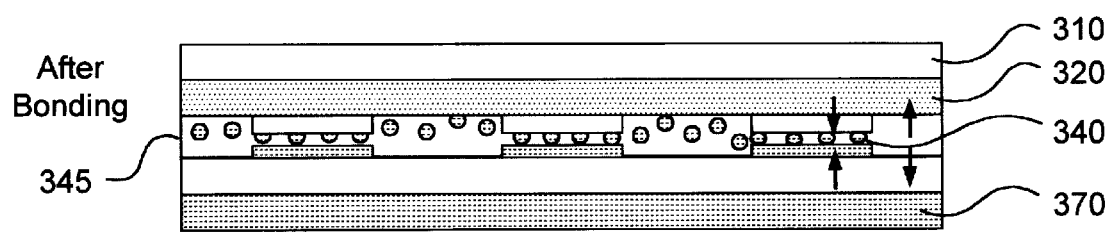
FIG. 3C illustrates a schematic side view of the structural sub-components of the anisotropic conductive film connector assembly shown in FIG. 3B after bonding, representing an embodiment of the invention.

Referring to FIGS. 3B and 3C, a larger scale image of the work product being processed in FIG. 1 can be seen. FIG. 3B shows these sub-assemblies before bonding. In contrast, FIG. 3C shows the sub-assemblies after bonding. A polyimide film 310 is coupled to a an interlayer 320. A plurality of copper traces 330 are coupled to the interlayer 320. These three components (310, 320, 330) can be readily purchased as a sub-assembly. A layer of anisotropic conductive film 345 is positioned beneath the plurality of copper traces 330. The layer of anisotropic conducting film 345 includes conductive particles 340 and an anisotropic conductive film binder 350. The film 345 can be readily purchased.

An LCD screen 365 is located beneath the layer of anisotropic conducting film 345. The LCD screen 365 includes a glass substrate 370 and a plurality of indium tin oxide traces 360. The traces can be etched from a deposited coating and the screen 365 can be readily purchased as a sub-assembly.

After sufficient pressure and temperature are applied, the sub-assemblies are joined as shown in FIG. 3C. It can be appreciated that there are compressive stresses on the particles 340 and tensile stress on the adhesive 320. The compressive forces are represented by the two arrows that point toward one another. In contrast, the tensile stresses are represented by the two arrows that point away from one another.

Example 2

Referring to FIGS. 2B–2D, a connector alignment process shall now be described. A circuit board 290 with a ground plane 270 defining an aperture was prepared and placed into an alignment apparatus. Although the aperture defined by ground plane 270 was rectilinear, the aperture could easily be any other shape.

For instance, referring to FIG. 2A, a circuit board 200 with an oval shaped optical radiation conducting aperture 202 is depicted. A first plurality of pitch leads 203 is located coincident with the oval shaped optical radiation conducting aperture 202. Similarly, circuit board 200 includes a rectilinear shaped optical radiation conducting aperture 204 that is associated with the second plurality of pitch leads 205. Similarly, circuit board 200 includes a circularly shaped optical radiation conducting aperture 206 that is associated with a third plurality of radially arranged leads 207. Referring again to FIGS. 2B–2D, a source of optical radiation 210 provides light for transmission through the aperture. Light that is transmitted through the aperture can be detected by optical radiation detector 220. The output of detector 220 is shown in FIG. 2D.

Still referring to FIGS. 2B–2D, a pitch connector includes a polyimide film 225, an optional interlayer 230 and a first plurality of pitch leads 240. It should be noted that the use of a separate film and interlayer in this example is not required and that the functional properties of the interlayer could be incorporated into the film 225. Similarly, the pitch leads 240 could be incorporated into the film. These three components (225, 230, 240) together form a sub-assembly that can be readily commercially obtained.

In addition to the ground plane 270, the circuit board 290 includes an interlayer 260 and a second plurality of pitch leads 250. Again, it should be noted that the use of an interlayer separate from the circuit board 290 is not required and that the functional properties of the interlayer could be incorporated into the circuit board 290. Similarly, the of pitch leads 250 could be incorporated into the circuit board 290.

It can be appreciated that the first plurality of pitch leads 240 is not aligned with the second plurality of pitch leads 250 with regard to the X-Y plane. In this example, the apparatus into which the polyimide film 225 and its associated adhesive 230 and pitch leads 240 are mounted is movable with respect to the X-Y plane. This permits the two sub-assemblies to be aligned with regard to one another in the X-Y plane by displacing the upper assembly. However, it should be noted that alternative embodiments of the invention can place the lower sub-assembly into a movable fixture. Further, alternative embodiments of the invention can place both the upper sub-assembly and the lower sub-assembly into corresponding movable fixtures. In the latter case, both the upper and lower sub-assemblies can be moved with regard to the X-Y plane. By placing both the upper and lower subassemblies into movable fixtures, a greater degree of alignment movement may be obtained and/or greater resolution of movement with regard to the X-Y plane may be achieved.

Referring to FIG. 2C, the upper and lower sub-assemblies have been moved with respect to one another in the X-Y plane compared to their arrangement in FIG. 2B. In this way, a larger portion of the optical radiation from the source of optical radiation to 10 passes through the aperture defined by ground plane 270 and is detected by the optical radiation detector 220.

Referring to FIG. 2D, the amount of detected optical radiation corresponding to the alignment state depicted in FIGS. 2B and 2C are represented. It can be appreciated that more radiation is detected when the upper and lower sub-assemblies are in the second alignment state. Moreover, the detected radiation will reach a maximum when the upper and lower sub-assemblies are optimally aligned. The pitch leads corresponding to the row and column drivers of an LCD display coupled to the board were coincident with the aperture.

Example 3

An LCD screen repair process shall now be described. The invention has the capability of providing all repairs on LCD screens, including STN and TFT color and monochrome screens. The invention can define a repair process that conforms with ISO 9000 principles and procedures. Proper electro static discharge (ESD) procedures and equipment should be utilized throughout the entire repair process, including receiving and shipping departments.

The repair process begins with recording screen serialization, and affixing a traveler to screen that will record the date repairs are performed and the technician accomplishing each process step. Determining the problem includes running complete diagnostics on each screen, defining and/or verifying problem(s). The customer is notified if screen is not repairable.

The repair process continues with replacement of faulty components. Preliminary tests are run to verify that the problem properly defined. The problem is then addressed. This may include replacing the backlight and/or faulty PCB components, including soldered ICs, caps and fuses. Addressing the problem can also include replacing the inverter board, as well as the contrast or brightness controls, if necessary. The removal of defective components is facilitated by optical thermal data gathering through optical radiation conducting zones. Alignment of replacement components and connection of the replacement components is also facilitated by the use of optical data gathering through optical radiation conducting zones.

Missing horizontal or vertical lines on the screen are a common failure caused by poor solder connections, failed driver ICs, and/or poor bonding of ICs to conductive traces on the glass. These faults require driver IC or COG replacement. Driver IC or COG replacement can be called ZAF (Z-Axis Film) bonding. ZAF requires close control of both I) de-bonding tension, temperature and time and II) bonding pressure, temperature and time to optimize the resulting adhesive cure, as shown in FIG. 3A. Proper curing will insure that electrical contact resistance is low and mechanical bond strength is high. FIGS. 3B–3C illustrate the principal of ZAF bonding and defines the stresses found in a typical bonded assembly.

Practical Applications of the Invention

A practical application of the invention that has value within the technological arts is aligning pitch connectors. Another practical application is bonding anisotropic conducting film connectors. Further, the invention is useful in conjunction with repairing LCD screens or circuit boards (such as those with defective connections or defective components), or the like. There are virtually innumerable uses for the invention, all of which need not be detailed here.

Advantages of the Invention

A circuit board process, representing an embodiment of the invention, can be cost effective and advantageous for at least the following reasons. The invention also permits leads to be more accurately and precisely aligned (or re-aligned) with contact pads. Thus, the alignment process can be effected more quickly and economically. The invention also permits bonding temperatures to be more accurately and precisely controlled. Thus, the bonding process can be effected more quickly and economically.

All the disclosed embodiments of the invention described herein can be realized and practiced without undue experimentation. Although the best mode of carrying out the invention contemplated by the inventors is disclosed above, practice of the invention is not limited thereto. Accordingly, it will be appreciated by those skilled in the art that the invention may be practiced otherwise than as specifically described herein.

For example, the individual components need not be formed in the disclosed shapes, or assembled in the disclosed configuration, but could be provided in virtually any shape, and assembled in virtually any configuration. Further, the individual components need not be fabricated from the disclosed materials, but could be fabricated from virtually any suitable materials. Further, although the aperture described herein can be a physically separate module, it will be manifest that the aperture may be integrated with the processing apparatus with which it is associated. Furthermore, all the disclosed elements and features of each disclosed embodiment can be combined with, or substituted for, the disclosed elements and features of every other disclosed embodiment except where such elements or features are mutually exclusive.

It will be manifest that various additions, modifications and rearrangements of the features of the invention may be made without deviating from the spirit and scope of the underlying inventive concept. It is intended that the scope of the invention as defined by the appended claims and their equivalents cover all such additions, modifications, and rearrangements. The appended claims are not to be interpreted as including means-plus-function limitations, unless such a limitation is explicitly recited in a given claim using the phrase "means-for." Expedient embodiments of the invention are differentiated by the appended subclaims.

What is claimed is:

1. A method of processing a substrate, comprising:

locating said substrate and a first connector between a source of optical radiation and an optical radiation detector, said substrate having an optical radiation conductive zone and a second connector that is at least partially coincident with said optical radiation conductive zone; and aligning said first connector and said second connector with respect to at least one axis so as to substantially maximize the amount of optical radiation from said source of optical radiation that is detected by said optical radiation detector.

2. The method of claim 1, wherein said optical radiation conductive zone is defined by an aperture formed in a ground plane that composes said substrate.

3. The method of claim 1, wherein said first connector includes a first plurality of conductive leads defining a first pitch connector and said second connector includes a second plurality of conductive leads defining a second pitch connector.

4. The method of claim 3, wherein said first connector is a tape automated bonding system connector.

5. The method of claim 1, further comprising aligning said first connector and said second connector with respect to another axis so as to substantially maximize the amount of optical radiation from said source of optical radiation that is detected by said optical radiation detector.

6. The method of claim 1, further comprising bonding said first connector to said second connector so as to form an electronic connection between said first connector and said second connector.

7. A method of processing a substrate, comprising:

locating said substrate and a first connector between a bonding head and an optical radiation detector, said substrate having an optical radiation conductive zone and a second connector that is at least partially coincident with said optical radiation conductive zone; and bonding said first connector to said second connector so as to form an electronic connection between said first connector and said second connector, wherein bonding includes moving said bonding head away from both said first connector and said second connector after a time period that is at least in part a function of a temperature that is measured by said optical radiation detector.

8. The method of claim 7, wherein said optical radiation conductive zone is defined by an aperture formed in a ground plane that composes said substrate.

9. The method of claim 7, wherein said first connector includes a first plurality of conductive leads defining a first pitch connector and said second connector includes a second plurality of conductive leads defining a second pitch connector.

10. The method of claim 9, wherein said first connector is a tape automated bonding system connector.

11. The method of claim 7, wherein locating said substrate and said first connector between a heated bonding head and an optical radiation detector includes locating an anisotropic conductive film between said first connector and said second connector.

12. The method of claim 6, further comprising aligning said first connector with said second connector with respect to at least one axis so as to substantially maximize the amount of optical radiation that is detected by said optical radiation detector.

13. A method of processing a substrate, comprising:

locating said substrate and a first connector between I) 1) a source of optical radiation and 2) a bonding head and II) an optical radiation detector, said substrate having an optical radiation conductive zone and a second connector that is at least partially coincident with said optical radiation conductive zone;

aligning said pitch connector with said pitch connector with respect to at least one axis so as to substantially maximize the amount of optical radiation from said source of optical radiation that is detected by said optical radiation detector; and bonding said first connector to said second connector so as to form an electronic connection between said first connector and said second connector, wherein bonding includes moving said bonding head away from both said first connector and said second connector after a time period that is at least in part a function of a temperature that is measured by said optical radiation detector.

14. The method of claim 13, wherein said optical radiation conductive zone is defined by an aperture formed in a ground plane that composes said substrate.

15. The method of claim 13, wherein said first connector includes a first plurality of conductive leads defining a first pitch connector and said second connector includes a second plurality of conductive leads defining a second pitch connector.

16. The method of claim 15, wherein said first connector is a tape automated bonding system connector.

17. The method of claim 13, wherein locating said substrate and said first connector between a heated bonding head and an optical radiation detector includes locating an anisotropic conductive film between said first connector and said second connector.

* * * * *